United States Patent
Moon et al.

(10) Patent No.: US 6,974,748 B2
(45) Date of Patent: Dec. 13, 2005

(54) SEMICONDUCTOR DEVICE WITH SPLIT GATE ELECTRODE STRUCTURE AND METHOD FOR MANUFACTURING THE SEMICONDUCTOR DEVICE

(75) Inventors: Jung-Ho Moon, Seoul (KR); Jae-Min Yu, Seoul (KR); Don-Woo Lee, Gyeonggi-do (KR); Chul-Soon Kwon, Seoul (KR); In-Gu Yoon, Gyeonggi-do (KR); Yong-Sun Lee, Seoul (KR); Jae-Hyun Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/920,158

(22) Filed: Aug. 18, 2004

(65) Prior Publication Data

US 2005/0042828 A1    Feb. 24, 2005

(30) Foreign Application Priority Data

Aug. 21, 2003 (KR) ................ 2003-57771

(51) Int. Cl.[7] ........................................... H01L 21/336
(52) U.S. Cl. ................ 438/267; 438/258; 438/265
(58) Field of Search ............... 438/201, 211, 257–367, 438/275, 594

(56) References Cited

U.S. PATENT DOCUMENTS

| 4,553,316 A | 11/1985 | Houston et al. | 29/571 |
|---|---|---|---|
| 6,541,324 B1 | 4/2003 | Wang | 438/201 |
| 6,563,167 B2 * | 5/2003 | Chern | 257/316 |
| 6,784,039 B2 * | 8/2004 | Hsieh | 438/201 |
| 6,800,525 B2 * | 10/2004 | Ryu et al. | 438/257 |
| 2002/0146886 A1 * | 10/2002 | Chern | 438/295 |
| 2003/0113969 A1 * | 6/2003 | Cho et al. | 438/257 |
| 2003/0139010 A1 * | 7/2003 | Wang | 438/257 |
| 2004/0023458 A1 * | 2/2004 | Hsu et al. | 438/267 |
| 2004/0248367 A1 * | 12/2004 | Shyu et al. | 438/257 |

FOREIGN PATENT DOCUMENTS

| KR | 1020020068926 | 8/2002 |
|---|---|---|
| KR | 1020030010212 A | 2/2003 |
| KR | 1020030027393 A | 4/2003 |

* cited by examiner

Primary Examiner—Jennifer M. Kennedy
(74) Attorney, Agent, or Firm—Volentine Francos & Whitt, PLLC (57) ABSTRACT

A semiconductor device includes a substrate divided into a memory cell region and a logic region. A split gate electrode structure is formed in a memory cell region of a substrate. A silicon oxide layer is formed on a sidewall of the split gate electrode structure and a surface of the substrate. A word line is formed on the silicon oxide layer that is positioned on the sidewall of the split gate electrode structure. The word line has an upper width and a lower width. The lower width is greater than the upper width. A logic gate pattern is formed on a logic region of the substrate. The logic gate pattern has a thickness thinner than the lower width of the word line.

10 Claims, 8 Drawing Sheets

SEMICONDUCTOR DEVICE WITH SPLIT GATE ELECTRODE STRUCTURE AND METHOD FOR MANUFACTURING THE SEMICONDUCTOR DEVICE

BACKGROUND OF THE INVENTION

1. Field of the Invention

Embodiments of the present invention relate to a semiconductor device having a single chip in which a memory device and a logic device are formed, and a method for manufacturing the semiconductor device. This application claims priority under 35 USC § 119 to Korean Patent Application No. 2003-57771, filed on Aug. 21, 2003, the contents of which are herein incorporated by reference in its entirety for all purposes.

2. Description of the Related Art

As a result of relatively high integration of semiconductor devices, there has been the development of a multi-chip structure having a memory device and a logic device formed in a single chip. The memory device may include a volatile memory device (e.g. a dynamic random access memory (DRAM) device or a static random access memory (SRAM) device) or a non-volatile memory device (e.g. a flash memory device). When the memory device and the logic device are included in the single chip, the multi-chip may have relatively small size, relatively low consumption power, relatively rapid operation, and relatively low electro magnetic interference (EMI).

For example, a multi-chip may include a merged DRAM & logic (MDL) device (in which a DRAM device and a logic device are incorporated together), or a merged flash & logic (MFL) device (in which a flash memory device and a logic device are incorporated together).

A gate electrode of the MFL device may include a split gate that is formed by a self-aligning method. An example of a method of forming the self-aligned split gate is disclosed in U.S. Pat. No. 4,553,316. According to the disclosed method, a control gate is formed to have the split gate shape. Thus, a coupling coefficient of a memory cell having under a minute design rule increases. The gate electrode having a high efficiency of elimination/program may also be formed.

In a method of forming a MFL device, a substrate is divided into a memory device region and a logic device region. An isolation process is performed against the substrate to divide the substrate into an active region and a field region. A first silicon oxide layer is formed on the substrate. A first polysilicon layer is formed on the first silicon oxide layer. A first nitride layer pattern is formed on the first polysilicon layer. The first polysilicon layer is partially etched using the first nitride layer pattern as an etching mask until the first polysilicon layer is exposed. A second silicon oxide layer is formed on the first nitride layer pattern and the exposed first polysilicon layer.

The second silicon oxide layer is anisotropically etched to form a second silicon oxide layer pattern on a sidewall of the first nitride layer pattern. The first polysilicon layer and the first silicon oxide layer are etched using the second silicon oxide layer pattern as an etching mask to expose a surface of the substrate. A third silicon oxide layer pattern is formed on a sidewall of the first polysilicon layer. Impurities are then implanted into the exposed surface of the substrate to form a source region. Polysilicon is deposited to fill a space between the second silicon oxide layer patterns to form a source line electrically connected to the substrate. The first nitride layer pattern is then removed. The first polysilicon layer and the first silicon oxide layer are subsequently etched to form a split gate structure. Here, the layers formed in the logic device region are entirely etched to expose the surface of the substrate.

A fourth silicon oxide layer is formed in the split gate structure. A second polysilicon layer is formed on the fourth silicon oxide layer. A second silicon nitride layer is formed on the second polysilicon layer. The second polysilicon layer and the second silicon nitride layer are planarized. The second silicon nitride layer is then removed. The substrate is thermally oxidized to selectively form a fifth silicon oxide layer on the source line and the second polysilicon layer. A photoresist pattern defining a gate electrode of a logic circuit is formed on the second polysilicon layer in the logic device region. The second polysilicon layer is anisotropically etched using the photoresist pattern as an etching mask to form a word line on a sidewall of the split gate structure and a gate pattern on the logic device region.

However, since the second polysilicon layer is etched to simultaneously form the word line and the gate pattern, sizes of the word line and the gate pattern may not be readily controlled. That is, when the gate pattern is too thin, a channel length of the word line is reduced. On the contrary, when the gate pattern is too thick, the channel length of the word line is augmented.

When a line width of the gate pattern is reduced due to the highly-integrated semiconductor device, the gate pattern having adequate thickness is required. Accordingly, the word line may have a short channel length which effects the controllability of its threshold voltage. Uncontrollability of the threshold voltage may result in failure of the semiconductor device (e.g. a punch-through). Further, as the channel length of the word line is reduced, the program/elimination of the semiconductor device may malfunction.

SUMMARY OF THE INVENTION

Embodiments of the present invention relate to a semiconductor device incorporating a split gate memory device and a logic device. Other embodiments relate to a method for manufacturing a semiconductor device incorporating a split gate memory device and a logic device.

A semiconductor device in accordance with embodiments of the present invention includes a substrate divided into a memory cell region and a logic region. A split gate electrode structure is formed on a memory cell region of the substrate. A silicon oxide layer is formed on a sidewall of the split gate electrode structure and a surface of the substrate. A word line is formed on the silicon oxide layer that is positioned on the sidewall of the split gate electrode structure. The word line has an upper width and a lower width, with the lower width being greater than the upper width. A logic gate pattern is formed on a logic region of the substrate. The logic gate pattern has a thickness less than the lower width of the word line.

In a method for manufacturing a semiconductor device (in accordance with embodiments of the present invention), a split gate electrode structure is formed on a memory cell region of a substrate. A silicon oxide layer is formed on the split gate electrode structure and the substrate. A polysilicon layer is formed on the silicon oxide layer. An oxide spacer is formed on a sidewall of the polysilicon layer that is positioned over the split gate electrode structure. A silicon nitride layer is formed on the polysilicon layer and the oxide spacer. The silicon nitride layer and the polysilicon layer are polished to form two polysilicon layers that are divided by the split gate electrode structure. The silicon nitride layer is then removed. The divided polysilicon layers are selectively etched to form a word line having an upper width and a lower width greater than the upper width on sidewalls of the split gate electrode structure, and a logic gate electrode pattern on a logic region of the substrate.

According to embodiments of the present invention, the lower width of the word line corresponds to a channel length of the word line and is separately controlled from the thickness of the logic gate electrode in a semiconductor device in which a memory device and a logic device are formed. Therefore, although the logic gate electrode is relatively thin, the channel length of the word line is not reduced. As a result, failure of the semiconductor device may not occur and reliability of the semiconductor device may not be deteriorated.

BRIEF DESCRIPTION OF THE DRAWINGS

Example

Example

DESCRIPTION OF THE PREFERRED EMBODIMENTS

Example embodiments of the present invention are described hereinafter with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
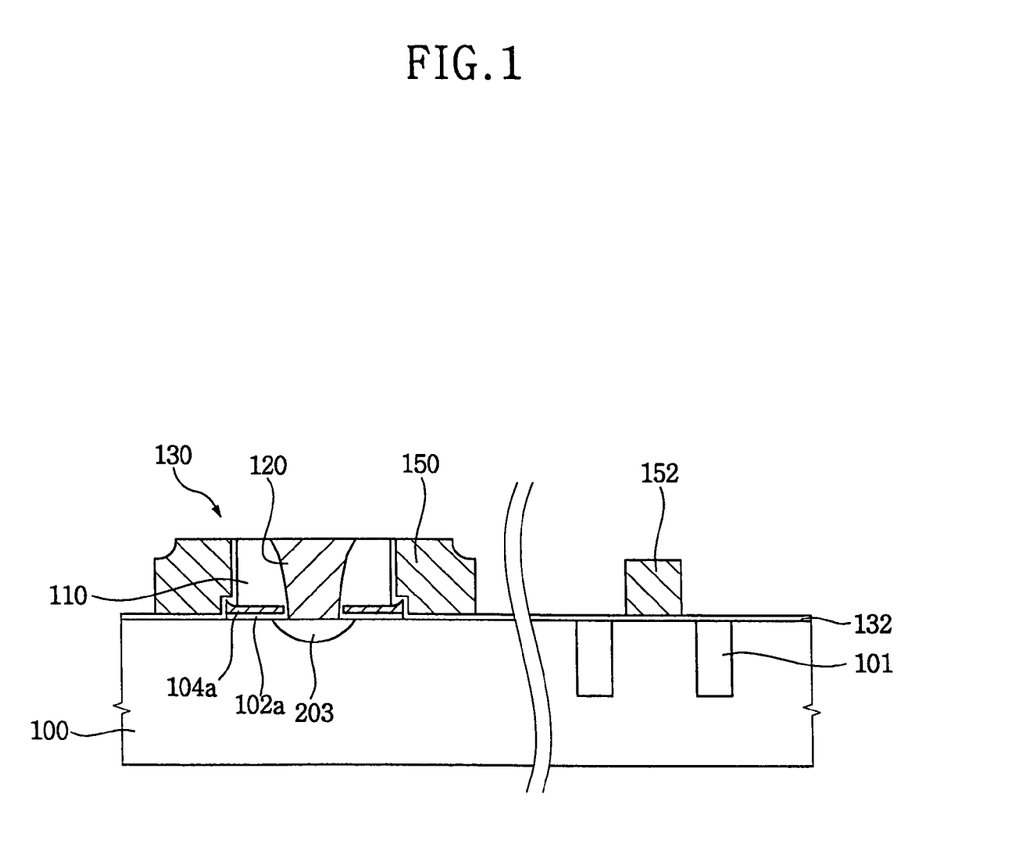
FIG. 1 is a cross sectional view illustrating an MFL device, in accordance with embodiments of the present invention.

Example FIG. 1 is a cross sectional view illustrating an MFL device, in accordance with embodiments of the present invention. A substrate 100 is divided into a memory cell region (in which a memory cell is formed) and a logic region (in which a logic device is formed). The substrate 100 has an active region and a field region 101.

Split gate electrode structures 130 are formed on the memory cell region. The split gate electrode structures 130 include split gate oxide layer patterns 102a, split gate patterns 104a, and silicon oxide layer patterns 110. A source line 120 is formed in a gap between the silicon oxide layer patterns 110. The source line 120 is electrically connected to the substrate 100. Impurities are implanted into an upper portion of the substrate 100 that is electrically connected to the source line 120 to form a source region 203. The split gate oxide layer pattern 102a may serve as a floating gate oxide layer pattern of a flash memory. The split gate pattern 104a may serve as a floating gate.

A silicon oxide layer 132 is formed on a surface of the substrate 100 and a sidewall of the split gate electrode structure 130. The silicon oxide layer 132 serves as a gate oxide layer of the logic device, an oxide layer of a word line, and a tunnel gate between the split gate pattern 104a and the word line.

The word line 150 is provided at the sidewall of the split gate electrode structure 130 on which the silicon oxide layer 132 is formed. The word line 150 has an upper portion and a lower portion. The lower portion of the word line 150 has a lower width. The lower width is greater than an upper width of the upper portion. The lower portion of the word line 150 has a protruded portion. Here, the lower width of the word line 150 corresponds to a channel length of the word line 150. Accordingly, the channel length of the word line 150 is lengthened by a width of the protruded portion.

A tip is formed on an end of the split gate pattern 104a orienting toward the word line 150. When data is erased from the split gate pattern 104a, electric charges charged in the split gate pattern 104a are readily discharged through the tip to the word line 150. When data is programmed in the split gate pattern 104a, a voltage applied in the word line 150 is coupled to the split gate pattern 104a.

A logic gate pattern 152 is formed on the logic region. The logic gate pattern 152 has a thickness less than the channel length of the word line 150. Since the lower portion of the word line 150 has the protruded portion, the channel length of the word line 150 may be guaranteed, regardless of the thickness of the logic gate pattern 152.

Example FIGS. 2 to 14 are cross sectional views illustrating a method for manufacturing an MFL device, in accordance with embodiments of the present invention.

Figure 2:
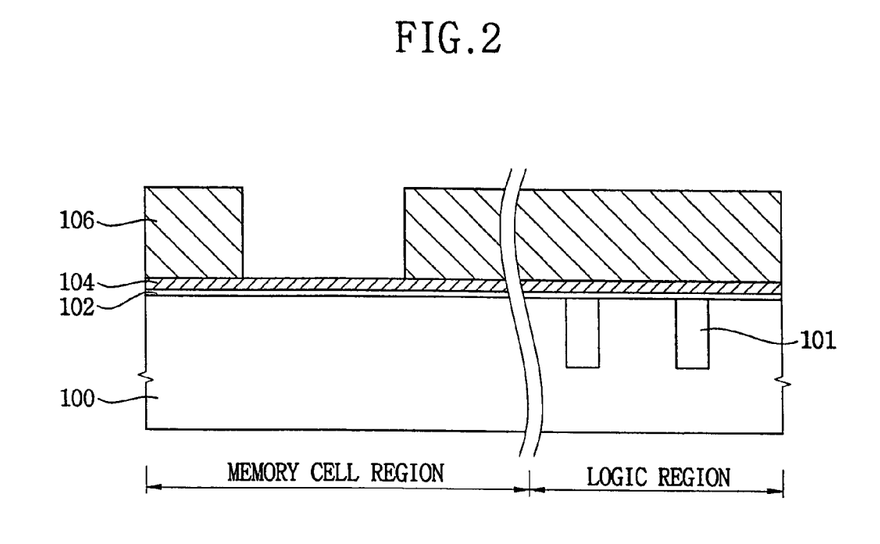
FIGS. 2 to 14 are cross sectional views illustrating a method for manufacturing an MFL device, in accordance with embodiments of the present invention.

Referring to FIG. 2, a substrate 100 is divided into a memory cell region (in which a memory cell is formed) and a logic region (in which a logic device is formed). The substrate 100 is isolated to form an active region and a field region 101. The isolation process may include a shallow trench isolation (STI) process.

A first silicon oxide layer 102 is formed on the substrate 100. A first polysilicon layer 104 (used for a floating gate) is formed on the first silicon oxide layer 102. A first nitride layer (not shown) is formed on the first polysilicon layer 104. A portion of the first nitride layer in the memory cell region is partially etched to form a first nitride layer pattern 106 defining a floating gate region.

Figure 3:
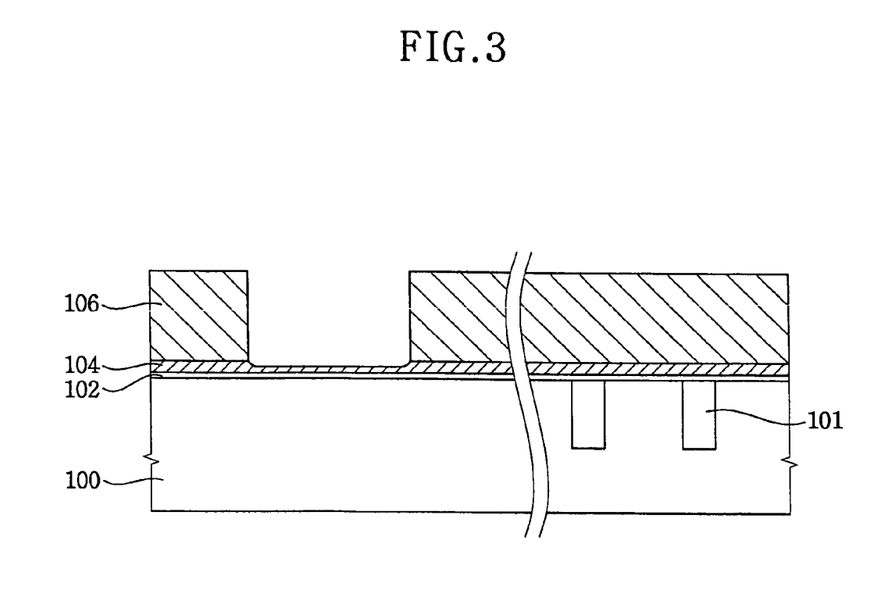

Referring to FIG. 3, the first polysilicon layer 104 is etched partially and isotropically using the first nitride layer pattern 106 as an etching mask. While isotropically etching the first polysilicon layer 104, edges of the first polysilicon layer 104 in contact with the first nitride layer pattern 106 are slowly etched compared to other portions of the first polysilicon layer 104, so that the edges of the first polysilicon layer 104 have a rounded shape. The isotropical etching process may include a plasma etching process or a wet etching process. The rounded edges of the first polysilicon layer 104 are edges of a split gate pattern formed by a subsequent process. Accordingly, the edges of the split gate pattern have a sharp tip.

Figure 4:
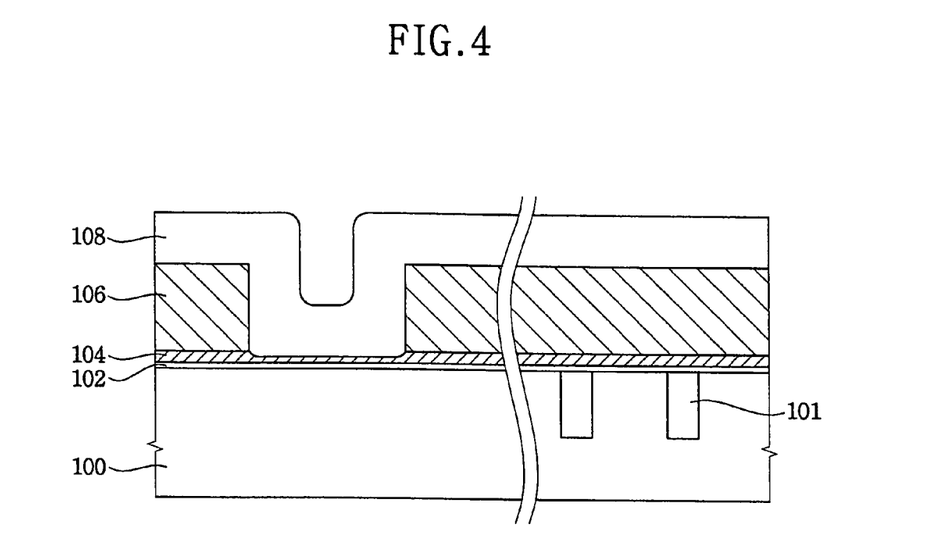
Figure 5:
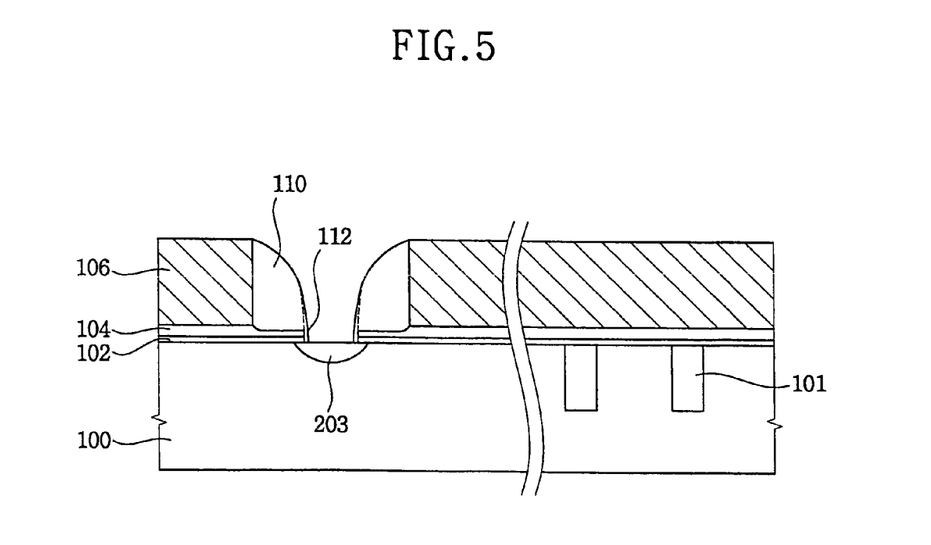

Referring to FIG. 4, a second silicon oxide layer 108 is formed on the first nitride layer pattern 106 and an exposed surface of the first polysilicon layer 104. Referring to FIG. 5, the second silicon oxide layer 108 is anisotropically etched to form second silicon oxide layer patterns 110 on sidewalls of the first nitride layer pattern 106. Simultaneously, a surface of the first polysilicon layer 104 is exposed and the second silicon oxide layer 108 (on the first nitride layer pattern 106) is entirely removed.

The exposed surface of the first polysilicon layer 104 and the first silicon oxide layer 102 are subsequently etched to expose a surface of the substrate 100. Thus, the first polysilicon layer 104 is divided into two layers. Silicon oxide 112 is deposited on side faces of the divided first polysilicon layers 104 to prevent exposing the side faces of the divided first polysilicon layers 104.

Figure 6:
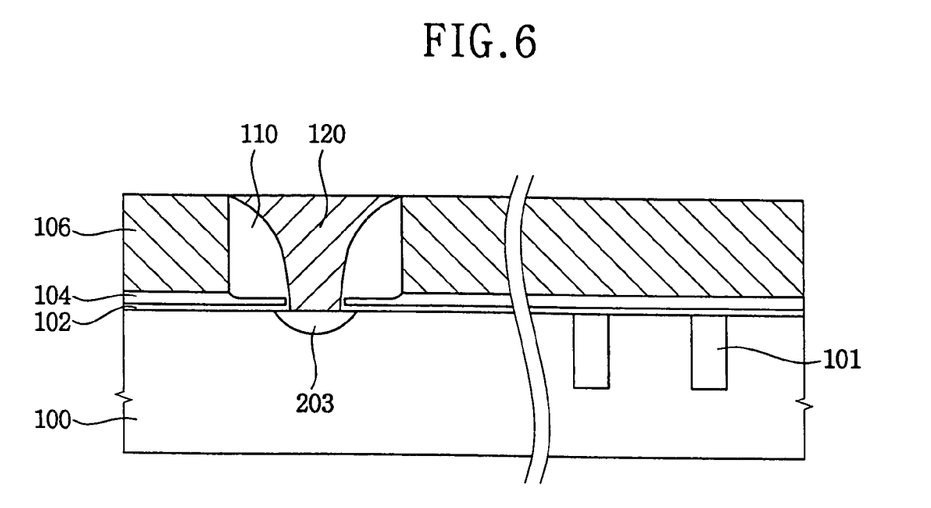

Impurities are implanted into the exposed surface of the substrate 100 to form a source region 203. A second polysilicon layer (not shown) is formed on the first nitride layer pattern 106 to fill a gap between the second silicon oxide layer patterns 110. The second polysilicon layer is electrically connected to the source region 203. As illustrated in FIG. 6, the second polysilicon layer is planarized by a chemical mechanical polishing (CMP) process or an etch back process for exposing the surface of the first nitride layer pattern 106 to form a source line 120.

Figure 7:
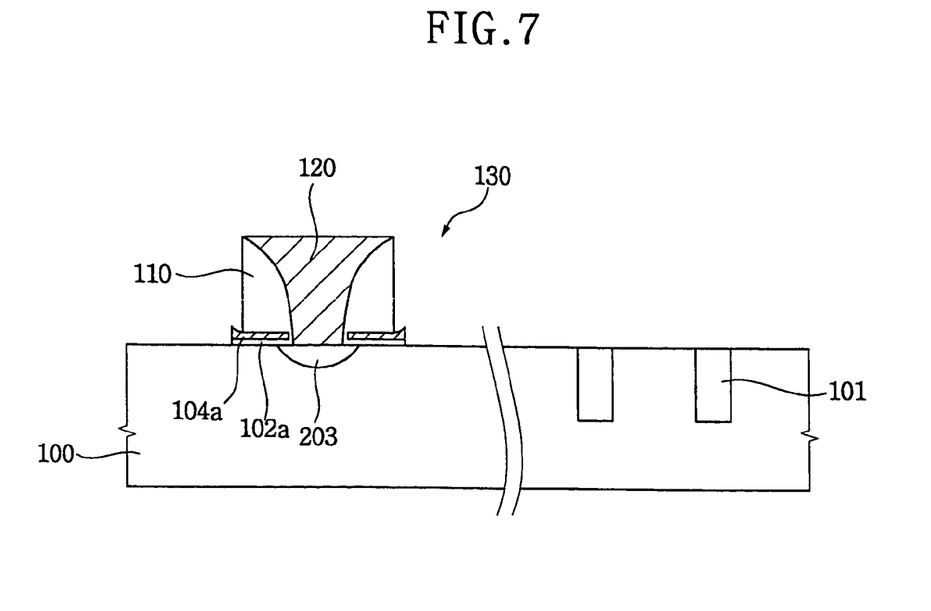

Referring to FIG. 7, the first nitride layer pattern 106 is removed. The first polysilicon layer 104 and the first silicon oxide layer 102, which are positioned under the first nitride layer pattern 106, are partially removed. As a result, a split gate electrode structure 130 is formed on the substrate 100. The split gate electrode structure 130 includes a split gate oxide layer pattern 102a, a split gate pattern 104a, the second silicon oxide layer pattern 110, and the source line 120. The split gate oxide layer pattern 102a may serve as a floating gate oxide layer of a flash memory. The split gate pattern 104a may serve as a floating gate of the flash memory.

When the split gate electrode structure 130 is formed, a photo mask pattern is not used. Thus, when the first polysilicon layer 104 is etched, a surface of the source line 102 is partially removed. In addition, when the first silicon oxide layer 102 is etched, the side faces of the second silicon oxide layer patterns 110 are partially removed.

Figure 8:
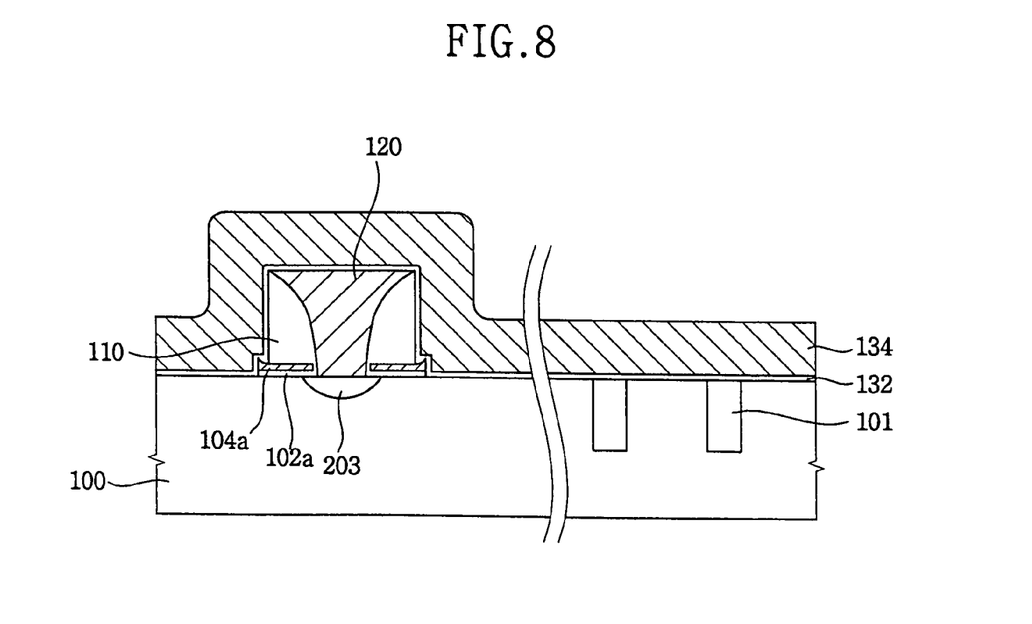

Referring to FIG. 8, a third silicon oxide layer 132 is formed on the split gate electrode structure 130 and the substrate 100. The third silicon oxide layer 132 serves as a gate oxide layer of the logic device, an oxide layer of a word line, and a tunnel gate between the first polysilicon layer pattern and the word line. A third polysilicon layer 134 having a uniform thickness is formed on the third silicon oxide layer 132. Accordingly, the third polysilicon layer 134 has a projection positioned on the split gate electrode structure 130. The third polysilicon layer 134 serves as a word line of the memory cell and a gate electrode of the logic device. Thus, the third polysilicon layer 134 has a thickness substantially identical to that of the gate electrode considering the thickness of the gate electrode that is determined in a design of the logic device.

However, as the width of the gate electrode is reduced, the thickness of the gate electrode is also reduced. When the gate electrode having a reduced width has an original thickness that is not reduced, the gate electrode may have an unstable structure. Further, when the gate electrode has a relatively large thickness, the gate electrode having a minute width may be not readily patterned. For example, when the gate electrode has a width of about 0.18 μm, the gate electrode has a thickness of about 2,500 Å to about 3,000 Å. As another example, when the gate electrode has a width of about 0.13 μm, the gate electrode has a thickness of about 1,300 Å to about 1,800 Å. When the third polysilicon layer 134 having a relatively small thickness is formed, the third polysilicon layer 134 positioned on the sidewall of the split gate electrode structure 130 may also have a relatively small thickness.

Figure 9:
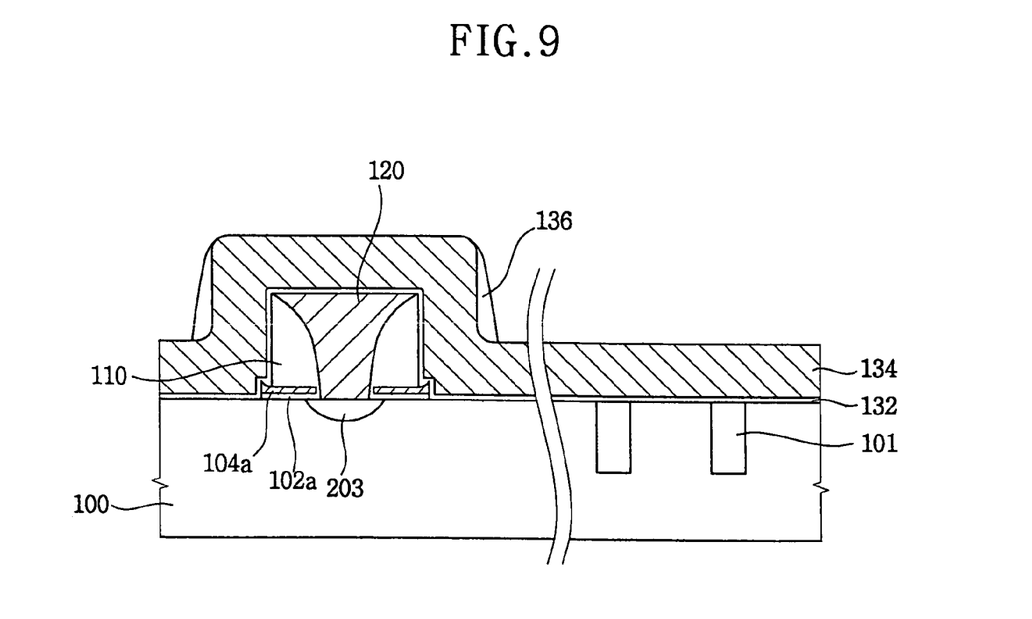

Referring to FIG. 9, a fourth silicon oxide layer (not shown) is formed on the third polysilicon layer 134. A thickness of the fourth silicon oxide layer determines a channel length of a word line. In other words, the channel length of the word line is lengthened proportional to a thickness increase of the fourth silicon oxide layer. The fourth silicon oxide layer is anisotropically etched to form a silicon oxide spacer 136 on a sidewall of the projection of the third polysilicon layer 134. The silicon oxide spacer 136 has a thickness substantially identical to a length difference between the channel length of the word line and a thickness of a logic gate electrode. For example, the silicon oxide spacer 136 may have a thickness of about 100 Å to about 1,000 Å.

Figure 10:
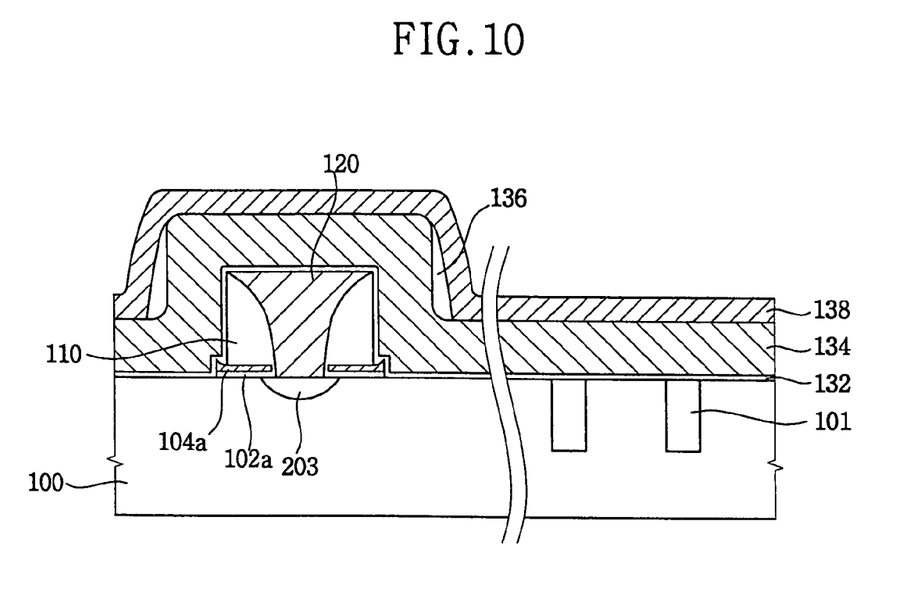
Figure 11:
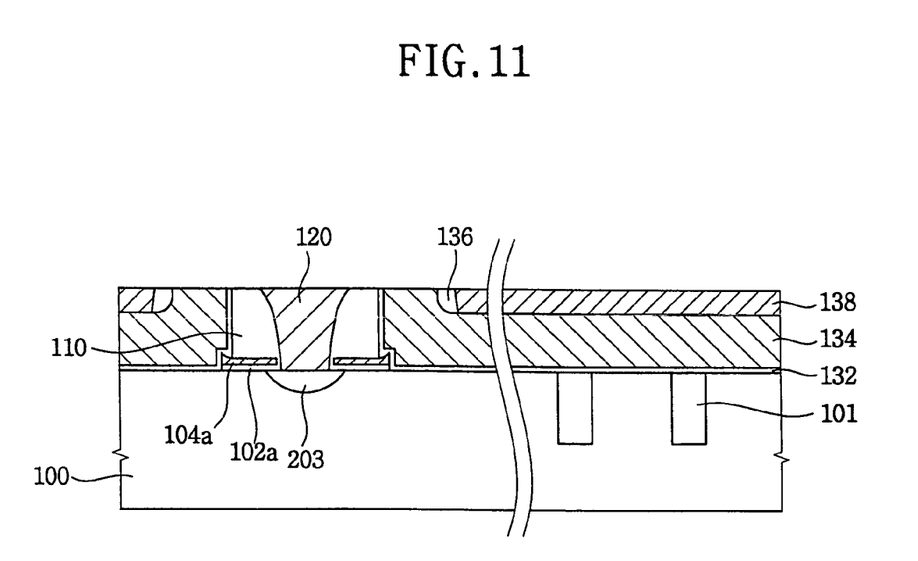

Referring to FIG. 10, a second silicon nitride layer 138 is formed on the third polysilicon layer 134 and the silicon oxide spacer 136. Referring to FIG. 11, the second silicon nitride layer 138 and the third polysilicon layer 134 are planarized to divide third polysilicon layer 134 by the split gate electrode structure 130. As a result, the second silicon nitride layer 138, the divided third polysilicon layer 134, the second silicon oxide layer pattern 110, and the source line 120 are exposed.

Figure 12:
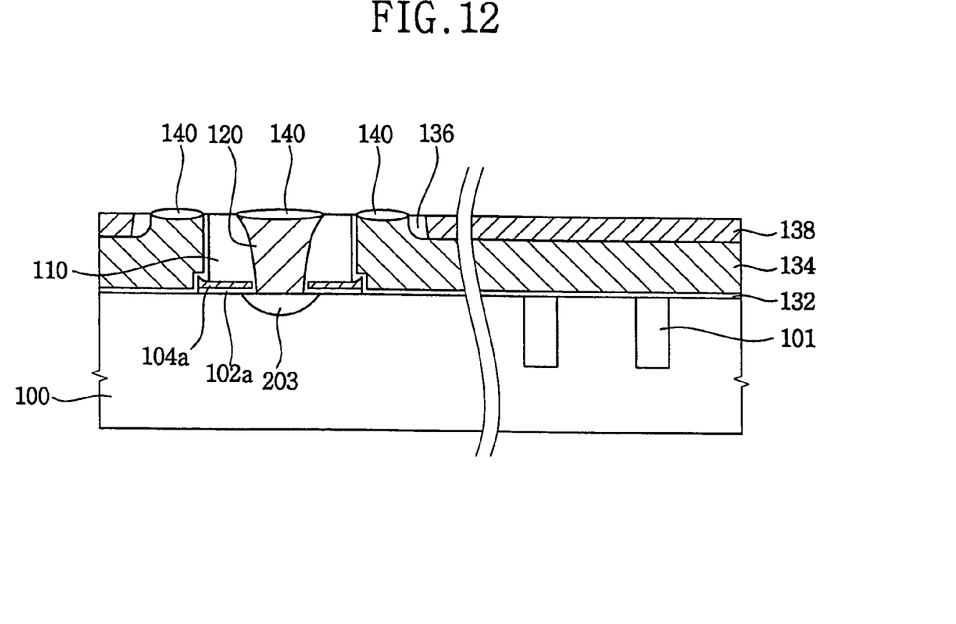
Figure 13:
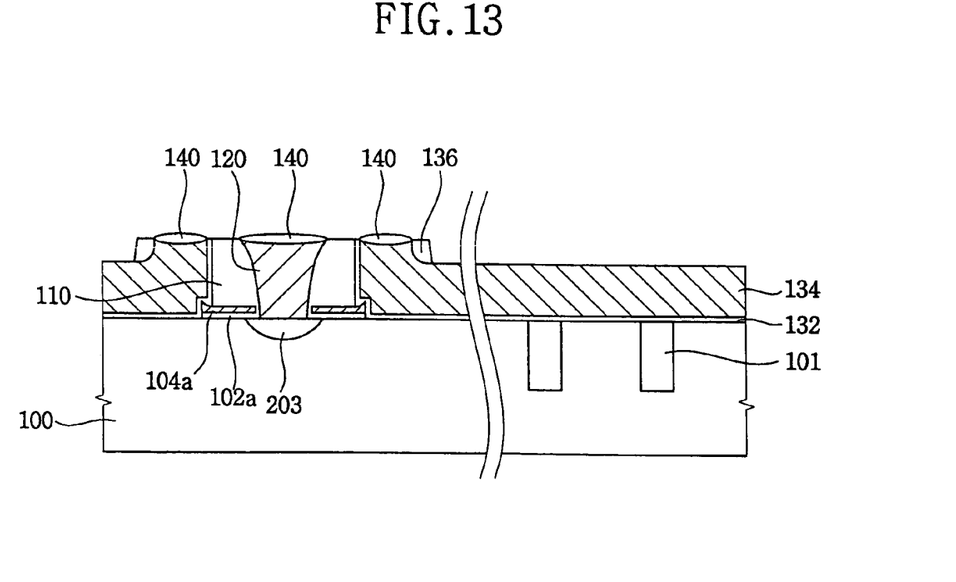

Referring to FIG. 12, the substrate 100 is thermally oxidized to form a fifth silicon oxide layer pattern 140 on the divided third polysilicon layer 134 and the source line 120. The fifth silicon oxide layer pattern 140 protects underlying layers from being etched in a subsequent etching process. Referring to FIG. 13, the second silicon nitride layer 138 is removed to expose the silicon oxide spacer 136. The second silicon nitride layer 138 may be removed using an etching solution that has a high etching selectivity ratio of the silicon nitride layer 138 with respect to the silicon oxide. The etching solution may include phosphorous.

Figure 14:
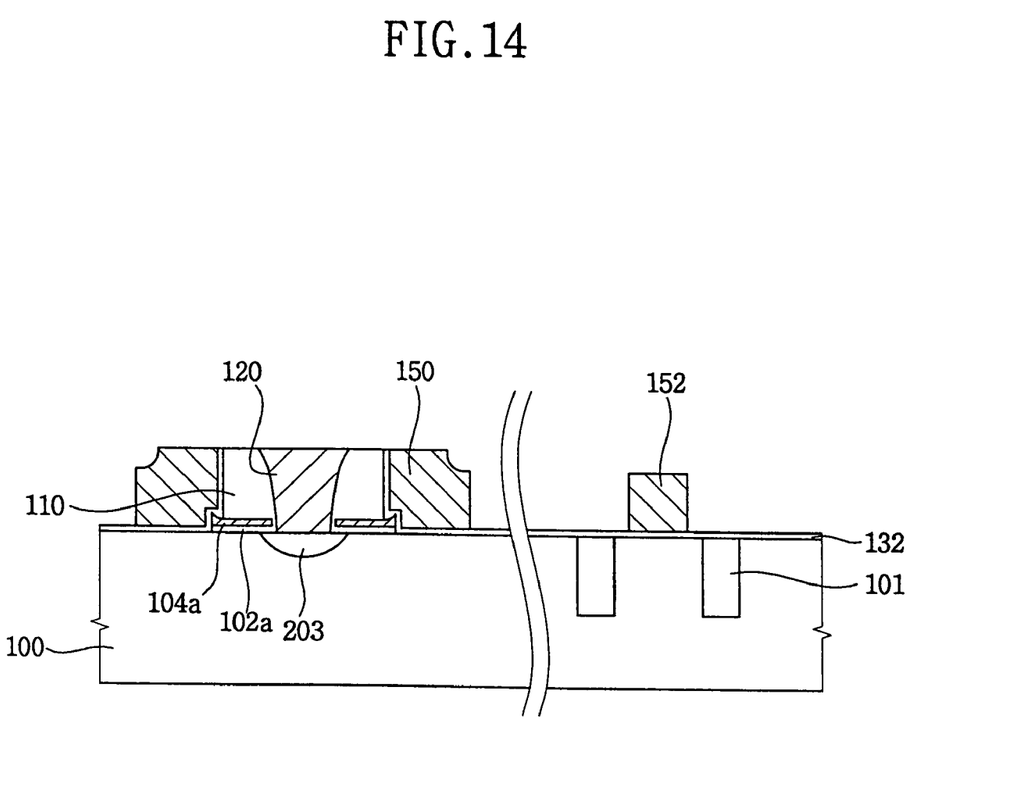

Referring to FIG. 14, a photoresist pattern (not shown) defining a logic gate pattern is formed on the logic region. The third polysilicon layer 134 is anisotropically etched using the photoresist pattern as an etching mask. The third polysilicon layer 134 may be etched using an etching gas that has a high etching selectivity ratio of the third polysilicon with respect to the silicon oxide.

Since the fifth silicon oxide layer pattern 140 and the silicon oxide spacer 136 on the memory cell region serve as a hard mask in the anisotropical etching process, a portion of the third polysilicon layer 134 positioned under the hard mask is not etched and only the rest of the third polysilicon layer 134 is etched. Accordingly, the word lines 150 having an upper portion and a lower portion having a protruded portion in a horizontal direction are formed on sidewalls of the split gate electrode structure 130. That is, the lower portion of the word line 150 has a lower width; the lower width is greater than an upper width of the upper portion of the word line 150. The lower width corresponds to a channel length of the word line 150. Simultaneously, a logic gate pattern 152 is formed on the logic region. The protruded portion of the lower portion may have a width substantially identical to a thickness of the silicon oxide spacer 136. Thus, the channel length of the word line 150 increases due to the protruded portion.

As described above, the silicon oxide spacer 136 is used as the hard mask in the anisotropical etching process. Accordingly, although the logic gate pattern 152 has a relatively small thickness, the channel length of the word line 150 is not reduced. The channel length of the word line 150 may be separately controlled, regardless of the thickness of the logic gate pattern 152 by controlling the thickness of the silicon oxide spacer 136. Therefore, the channel length of the word line 150 is controlled without additional photolithography processing or a process for repeatedly forming a polysilicon layer.

The silicon oxide spacer 136 and the fifth silicon oxide layer pattern 140 are then removed. A nitride spacer (not shown) is formed on a sidewall of the word line 150. Impurities are implanted into the substrate 100 adjacent to the nitride spacer to form a drain region (not shown). Oxide is deposited on the resultant structure to form an insulating interlayer (not shown). The insulating interlayer is partially etched to form a contact hole (not shown) exposing the drain region. The contact hole is filled with a conductive layer (not shown). The conductive layer is patterned to form a metal wiring electrically connected to the drain region.

According to embodiments of the present invention, the channel length of the word line is separately controlled from the thickness of the logic gate electrode in a semiconductor device in which a memory device and a logic device are formed. Although the logic gate electrode have a relatively small thickness, the channel length of the word line is not reduced. As a result, a failure of the semiconductor device may not occur and reliability of the semiconductor device may not be deteriorated.

Having described example embodiments above, it is noted that modifications and variations can be made by persons skilled in the art in light of the above teachings. It is therefore to be understood that changes may be made to the example embodiment of the present invention which are within the scope and the spirit of the invention, outlined by the appended claims.

What is claimed is:

1. A method for manufacturing a semiconductor device comprising:
   forming a split gate electrode structure in a memory cell region of a substrate;
   forming a silicon oxide layer on the split gate electrode structure and the substrate;
   forming a polysilicon layer on the silicon oxide layer;
   forming an oxide spacer on a sidewall of the polysilicon layer that is positioned over the split gate electrode structure;
   forming a silicon nitride layer on the polysilicon layer and the oxide spacer;
   polishing the silicon nitride layer and the polysilicon layer to form two polysilicon layers divided by the split gate electrode structure;
   removing the silicon nitride layer; and
   selectively etching the divided polysilicon layers to form a word line on sidewalls of the split gate electrode structure and a logic gate electrode pattern in a logic region of the substrate, wherein the word line has an upper width and a lower width, and wherein the lower width is greater than the upper width.

2. The method of claim 1, wherein forming the oxide spacer comprises:
   forming a silicon oxide layer on the polysilicon layer; and
   anisotropically etching the silicon oxide layer.

3. The method of claim 1, wherein the oxide spacer has a thickness substantially identical to that a difference between the lower width of the word line and a thickness of the logic gate electrode.

4. The method of claim 1, wherein the oxide spacer has a thickness of about 100 Å to about 1,000 Å.

5. The method of claim 1, wherein forming the split gate electrode structure comprises:
   forming a first oxide layer on the substrate;
   forming a first polysilicon layer as a floating gate on the first oxide layer;
   forming a first nitride layer pattern on the first polysilicon layer;
   forming a second oxide layer pattern on a sidewall of the first nitride layer pattern;
   etching the first polysilicon layer and the first oxide layer using the second oxide layer pattern as an etching mask to form first oxide layer patterns having a gap;
   filling the gap with a conductive layer to form a source line electrically connected to the substrate;
   removing the first nitride layer pattern; and
   etching the first polysilicon layer to form a split gate pattern.

6. The method of claim 5, further comprising partially etching the first polysilicon layer using the first nitride layer pattern as a mask.

7. The method of claim 6, wherein the first polysilicon layer is isotropically etched.

8. The method of claim 5, further comprising forming an insulating layer on a side face of the gap which prevents the split gate pattern from being electrically connected to the source line.

9. The method of claim 1, further comprising oxidizing surfaces of the polysilicon layer and the source line prior to removing the silicon nitride layer.

10. The method of claim 1, further comprising removing the oxide spacer after forming the word line and the logic gate electrode pattern.

* * * * *